United States Patent
Overweg et al.

(10) Patent No.: US 6,466,812 B1
(45) Date of Patent: Oct. 15, 2002

(54) MR METHOD FOR GENERATING ENHANCED NUCLEAR MAGNETIZATION

(75) Inventors: Johannes A. Overweg, Uelzen; Christoph G. Leussler, Hamburg, both of (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/517,715

(22) Filed: Mar. 2, 2000

(30) Foreign Application Priority Data

Mar. 12, 1999 (DE) ............ 199 11 043

(51) Int. Cl.$^7$ ............ A61B 5/055; G01V 3/00
(52) U.S. Cl. ............ 600/410; 600/419; 600/420; 324/306; 324/309; 324/319
(58) Field of Search ............ 600/410, 419, 600/420, 422; 324/306, 307, 309, 316, 318–320

(56) References Cited

U.S. PATENT DOCUMENTS

| | | | |
|---|---|---|---|
| 4,719,425 A | * 1/1988 | Ettinger | 324/316 |
| 5,154,603 A | * 10/1992 | Sepponen | 600/410 |
| 5,231,354 A | * 7/1993 | Leunbach | 324/316 |
| 5,296,811 A | * 3/1994 | Ehnholm et al. | 324/319 |
| 5,325,854 A | * 7/1994 | Ehnholm | 600/420 |
| 5,400,786 A | * 3/1995 | Allis | 600/410 |
| 5,564,421 A | * 10/1996 | Ehnholm | 600/410 |
| 5,617,859 A | * 4/1997 | Souza et al. | 600/420 |
| 5,936,404 A | * 8/1999 | Ladebeck et al. | 324/300 |
| 6,256,527 B1 | * 7/2001 | Leunbach et al. | 600/420 |
| 6,275,039 B1 | * 8/2001 | Young et al. | 324/319 |
| 6,311,086 B1 | * 10/2001 | Ardenkjaer-Larsen et al. | 600/420 |

OTHER PUBLICATIONS

"Development of a Resistive Fiedl Cycled MRI System" by P. Baras et al, in Proceedings SMR/ESRMB, Nice, 1995, p. 296.

"Design Considerations for Prepolarized MRI" by Steven Conolly et al. in Proceedings SMRM, New York, 1993, vol. 3, p. 1365.

"Analysis of Mode Spectra in Cylindrical N–Conductor Transmission Line Resonators with Expansion to Low–, High–and Band–Pass Birdcage Structures" by Peter Roschmann, in ESMRM, 1995, pp. 1000.

* cited by examiner

*Primary Examiner*—Shawna J Shaw

(57) ABSTRACT

The invention relates to an MR method in which the nuclear magnetization is enhanced under the influence of a first steady magnetic field and a second steady magnetic field acts on the nuclei previously influenced by the first magnetic field. According to the invention, the two magnetic fields overlap in time and enclose an angle other than 0° relative to one another, the angle preferably amounting to 90°. The enhanced nuclear magnetization is then sustained after the activation of the first steady magnetic field while the direction of the nuclear magnetization is determined by the second steady magnetic field. The use of two mutually perpendicular magnetic fields is advantageous notably for Overhauser imaging methods, because it enables the use of mutually perpendicular RF fields for the ESR saturation and the MR excitation, thus uncoupling the coils generating such RF fields from one another.

13 Claims, 2 Drawing Sheets

MR METHOD FOR GENERATING ENHANCED NUCLEAR MAGNETIZATION

BACKGROUND OF THE INVENTION

1. Field of the Invention

The invention relates to an MR method which includes the steps of:

generating an enhanced nuclear magnetization in an examination zone under the influence of a first steady magnetic field, applying a second steady magnetic field to the nuclei previously influenced by the first magnetic field, and carrying out at least one MR experiment after the first steady magnetic field has ceased to act on the nuclei but before the nuclear magnetization influenced by this magnetic field has decayed, the MR experiment including the excitation of the nuclear magnetization by means of an MR RF magnetic field under the influence of the second steady magnetic field. The invention also relates to a device for carrying out such a method.

2. Description of Related Art

A method of the kind set forth is already known from a publication by Baras et al. in Proceedings SMR/ESRMB, Nice, 1995, Vol. 2, page 296. According to the known method first an enhanced nuclear magnetization (or magnetic polarization) is generated by means of the first steady magnetic field. This magnetic field is only briefly switched on (therefore, in the context of the present invention the term "steady" is to be broadly interpreted; a magnetic field which has a steady value for only a few tenth of a second is also "steady" in this sense). The first steady magnetic field must be very strong, but the requirements imposed as regards its uniformity are very mild. Subsequently, a second steady magnetic field acts on the nuclei influenced by the first magnetic field, an MR experiment then being performed in the normal manner. The second steady magnetic field may be significantly weaker than the first field, but requires a homogeneity which suffices for the execution of MR examinations.

The enhanced nuclear magnetization realized by the first steady magnetic field continues to exist for some time after the deactivation of this field, and the associated enhanced signal-to-noise ratio can be used when the MR experiment (s) is/are carried out under the influence of the second steady magnetic field within a short distance in time from the first steady magnetic field.

Citation of a reference herein, or throughout this specification, is not to be construed as an admission that such reference is prior art to the Applicant's invention of the invention subsequently claimed.

SUMMARY OF THE INVENTION

It is an object of the present invention to improve a method of the kind set forth even further. This object is achieved according to the invention in that the directions of the first and the second steady magnetic field enclose an angle other than 0°, preferably 90°, relative to one another, and in that the two steady magnetic fields overlap in time.

As opposed to the cited known MR method, in which the two steady fields have the same direction, the directions of these two fields according to the invention enclose an angle other than 0°, preferably an angle of 90°. It is to be noted that the publication by Conolly et al in Proceedings SMRM, New York, 1993, Vol. 3, page 1365 already describes a method in which first a strong magnetic field is switched on and off in the x direction and subsequently a weak magnetic field which extends and oscillates in the z direction is activated, thus causing the vector of the nuclear magnetization, previously extending in the z direction, to be rotated in the x, y plane in conformity with the Larmor frequency.

The invention, however, is based on the recognition of the fact that when the nuclear magnetization comes under the influence of the second steady magnetic field while the first steady magnetic field is still effective and subsequently disappears, the nuclear magnetization vector is rotated from the direction imposed by the first magnetic field to the direction imposed by the second magnetic field.

The fact that the vector of the nuclear magnetization thus retains (for the time being) its value enhanced by the first steady magnetic field but is oriented in conformity with the second steady magnetic field can be utilized in various ways so as to improve MR examinations. In a first, preferred possibility, the generating of the enhanced nuclear magnetization includes the excitation of the electron spin resonance of a contrast agent, present in the object to be examined and containing un-paired electrons under the influence of the first steady magnetic field, by an ESR RF magnetic field, such that the directions of the ESR RF magnetic field and the MR RF magnetic field enclose an angle of at least approximately 90° relative to one another. In that case the nuclear magnetization is not enhanced by a particularly strong first steady magnetic field, but by the fact that, in conjunction with a (comparatively weak) magnetic field, the electron spin resonance (ESR) of a contrast agent which is present in the object to be examined and contains un-paired electrons is excited by an ESR RF magnetic field. The excitation of the electron spin resonance is then transferred to the nuclei and hence enhances the nuclear magnetization; this effect is generally referred to as the Overhauser effect. The subsequent excitation of the nuclear magnetization by an MR RF magnetic field in conjunction with a second (again comparatively weak) steady magnetic field produces MR signals with a signal-to-noise ratio of a quality that otherwise can be achieved only by means of significantly stronger magnetic fields.

In a further version, the first steady magnetic field is weaker than the second steady magnetic field. This version offers the advantage that the ESR RF magnetic field can still penetrate the examination zone sufficiently far and that an improved signal-to-noise ratio is obtained because of the stronger second steady magnetic field.

A device for carrying out the methods of this invention includes a magnet for generating a first steady magnetic field, an ESR RF coil system for generating an ESR RF magnetic field which extends at least substantially perpendicularly to the first steady magnetic field, and an MR RF coil system for generating and/or receiving an MR RF magnetic field, and is characterized in that there is provided a second magnet for generating a second steady magnetic field whose direction encloses an angle other than 0°, preferably 90°, relative to the direction of the first steady magnetic field, and in that the direction of the MR RF magnetic field extends at least substantially perpendicularly to the direction of the second steady magnetic field and to the direction of the ESR RF magnetic field. This device based on the following considerations: the frequency of the ESR RF magnetic field is a factor of approximately 660 greater than the frequency of the MR RF magnetic field. The ESR and the MR RF magnetic fields, therefore, must be generated by means of separate RF coils. If the RF fields were oriented in the same direction (which would be necessary if the two steady magnetic fields both extend in the same direction), strong interaction could occur between the coils. However, because the two steady magnetic fields extend perpendicularly to one another, the two RF fields, being temporally linked to a respective one of these fields, may also extend perpendicularly to one another, interaction between the RF coils generating these fields being avoided.

Therefore, it is also possible to use two coaxial RF coils (of a different type), which enclose one another and which enclose the examination zone. In the case of parallel oriented ESR and MR RF magnetic fields such a construction would either give rise to excessive interactions between the coils or, if the diameter of the MR coil were significantly greater than that of the ESR coil, to a drastically reduced signal-to-noise ratio. When the MR RF coil and the ESR RF coil in the device according to the invention very tightly enclose one another and the examination zone, a suitable signal-to-noise ratio will be obtained, because the coils do not influence one another, despite the fact that they are arranged so near one another.

In a further embodiment the MR RF coil includes a solenoid coil. A solenoid coil generates a magnetic field which extends in the direction of its axis. Even though there are also other coils generating a magnetic field in this direction, for example coils consisting of a plurality of circular conductor loops which are only inductively coupled to one another, a solenoid coil offers advantages in respect of the signal-to-noise ratio at low frequencies. Attractive embodiments of the ESR RF coil system include a quadrature coil of the bird-cage type, a TEM resonator, or an array of surface coils enclosing a cylindrical space. Such RF coil systems all generate RF magnetic fields extending perpendicularly to the coil axis.

In a further embodiment of the methods of this invention, the first steady magnetic field is switched on and off in a pulsed manner, is stronger than the second steady magnetic field, and the homogeneity of the second steady magnetic field is greater than that of the first steady magnetic field.

In this embodiment the enhanced nuclear magnetization is obtained in that the first steady magnetic field is significantly stronger than the second steady magnetic field. When the second steady magnetic field extends in the longitudinal direction of the examination zone,.the first steady magnetic field can be generated with the necessary strength by means of a comparatively simple coil.

In a further embodiment of the invention, the first steady magnetic field acts on a first part of the patient and the second steady magnetic field acts on a second part of the patient, and the blood of the patient flows from the first part to the second part. It utilizes the fact that the nuclear magnetization enhanced by the first magnetic field is transported, via the blood, to the second part where the second steady magnetic field acts on the nuclei influenced by the first magnetic field.

BRIEF DESCRIPTION OF THE DRAWING

The invention will be described in detail hereinafter with reference to the drawings. Therein.

DETAILED DESCRIPTION OF THE PREFERRED EMBODIMENT

Figure 1:
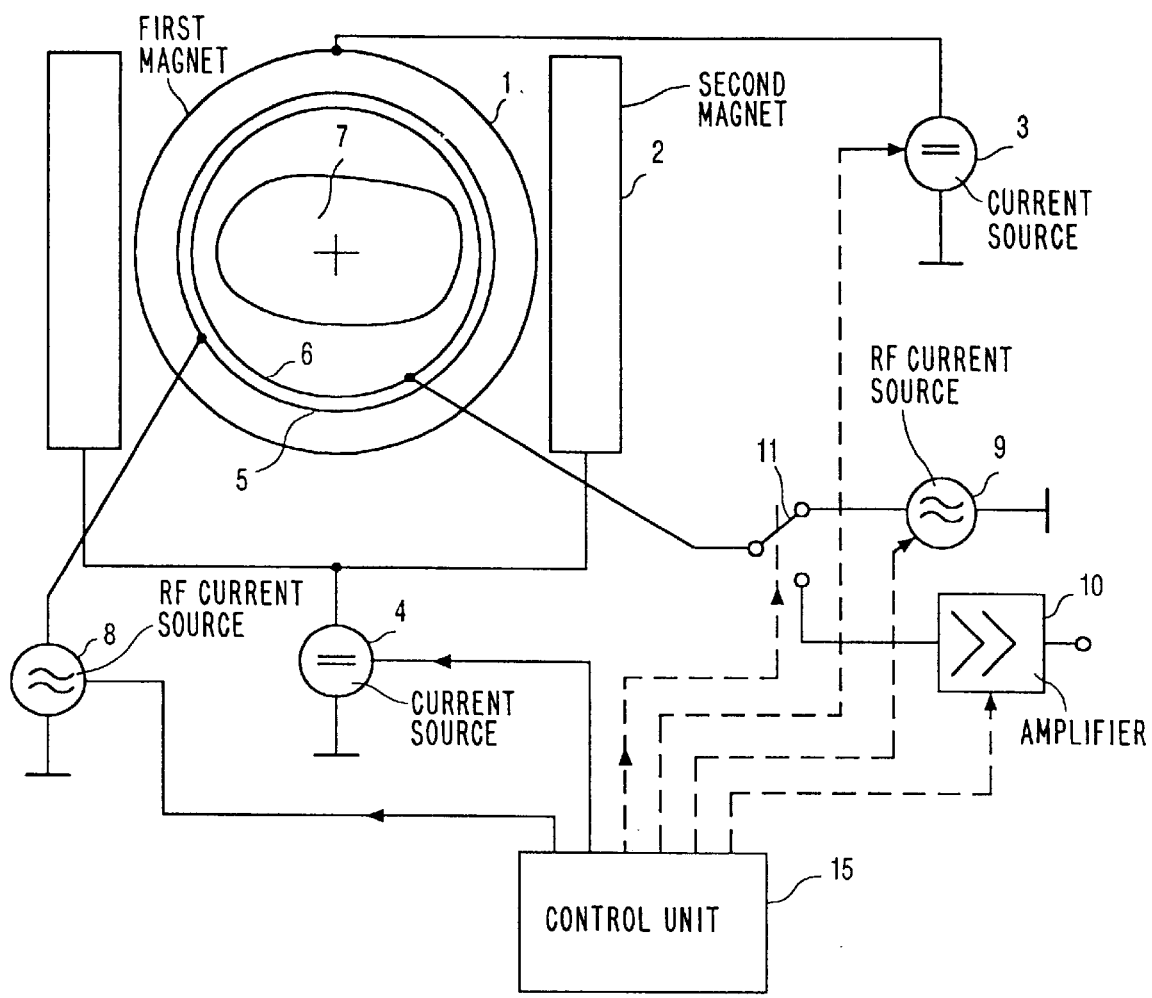
FIG. 1 is a block diagram of an MR apparatus for carrying out MR examinations on the basis of the Overhauser effect.

The reference numeral 1 in FIG. 1 denotes a magnet in the form of a coil 1 for generating a first steady magnetic field $B_{01}$ which extends perpendicularly to the plane of drawing (i.e. in the z direction). The magnetic field may have a strength of 5 mT and need not satisfy very severe requirements as regards homogeneity and temporal stability. A second magnet 2 produces a second steady magnetic field $B_{02}$ which extends in the x direction and hence perpendicularly to the first steady magnetic field $B_{01}$. This magnetic field has a strength of 15 mT. The homogeneity and the temporal stability of this magnetic field should satisfy the severe requirements generally imposed on MR apparatus. The currents for the magnets 1 and 2 are supplied by current sources 3 and 4 which can be switched on and off by a control unit 15.

An ESR coil 5, extending in the form of a cylinder in the direction perpendicular to the plane of drawing, generates an ESR RF magnetic field in an examination zone in which the object 7 to be examined is arranged. The ESR coil 5 should generate an RF magnetic field which extends perpendicularly to the first steady magnetic field B01 in order to saturate the electron spin resonance of the free (unpaired) electrons contained in a contrast agent injected into the object 7. The ESR coil 5 is preferably a quadrature coil of the so-called bird-cage type. As is known, such a coil is provided with conductors arranged on a cylinder surface and extending parallel to its longitudinal direction, the ends of said conductors being interconnected by way of a respective conductor loop; such a coil generates an RF magnetic field which rotates in the x-y plane. However, use can be made of a transverse electromagnetic (TEM) resonator instead. TEM resonators of this kind are described inter alia in a publication by Roschmann in Proceedings SMR/ESRMB, Nice 1995, page 1000. The ESR coil 5 may also be formed by a number of surface coils, each of which partly encloses the periphery of the examination zone.

The frequency $f_{ESR}$ of the ESR RF magnetic field is: $f_{ESR}=\gamma_e B_{01}$, where $\gamma_e$ is a gyromagnetic constant for electron spin resonance (approximately 28 GHz/T). for a strength of 5 mT of the steady magnetic field $B_{01}$, the frequency of the ESR RF field thus amounts to 140 MHz. Such high frequencies give rise to the problem that the penetration depth into the object 7 is small, that is to say smaller as the frequency of the ESR RF magnetic field is higher. Therefore, it is advantageous when the field strength of $B_{01}$ (5 mT) is less than that of the second steady magnetic field $B_{02}$ (15 mT).

The ESR RF coil 5 coaxially encloses a cylindrical MR RF coil 6 which also extends perpendicularly to the plane of drawing. However, the MR coil generates an RF magnetic field which extends in the z direction, so perpendicularly to the direction of the second steady magnetic field $B_{02}$. The MR coil is preferably a so-called solenoid coil. A solenoid coil includes a conductor which helically encloses the longitudinal axis of the coil which extends in the z direction. The frequency $f_{MR}$ of the MR RF magnetic field generated by the MR RF coil 6 is: $f_{MR}=\gamma_n B_{02}$, where $\gamma_n$ is the gyromagnetic ratio for protons (42 MHz/T). For $B_{02}$=15 mT, a frequency $f_{MR}$ of 630 kHz is obtained.

Because the directions in which the coils 5 and 6 act extend perpendicularly to one another, they partically do not influence one another. Therefore, they are allowed to enclose the examination zone tightly. The diameters of the coil 5 and 6 can also be chosen to be such that the ESR coil 5 is enclosed by the MR coil, so that the ESR coil has a somewhat stronger effect and the signal-to-noise ratio of the MR coil is slightly lower.

The currents for the two coils 5 and 6 are supplied by the RF current sources 8 and 9 which can also be controlled by the control unit 15. The MR signals appearing after the excitation by the MR RF magnetic field can also be received by the MR RF coil 6 and applied to an amplifier 10, after which they are digitized (in a manner not shown) and used to produce an MR image. The RF amplifier 10 and the RF current generator 9 are connected to the RF coil 6 via a switch 11. Instead of using the same RF coil for generating an RF field and for receiving RF signals, it is also possible to use separate coils for these purposes in known manner.

Figure 2:
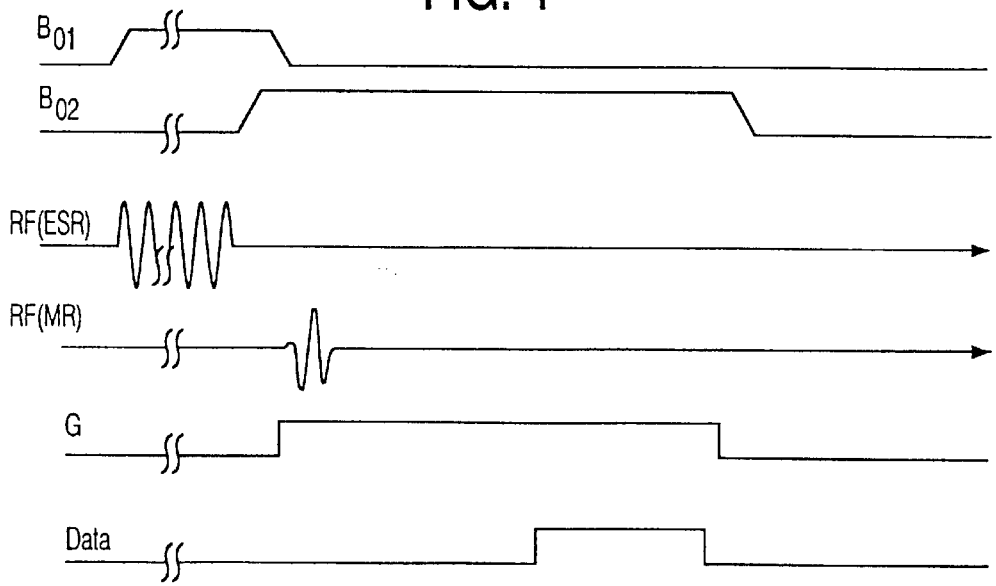
FIG. 2 shows the variation in time of various magnetic fields or signals during execution of such a method, FIG. 3. shows a second embodiment of an MR apparatus according to the invention.

FIG. 2 shows the execution in time of an MR examination performed by means of the MR apparatus shown in FIG. 1. The examination commences with the switching on and off of the first steady field $B_{01}$ (first line). When this field has reached its steady value, the ESR coil 5 generates an ESR RF magnetic field (third line) which saturates the spins of the free electrons present in the examination zone. The energy thus taken up in the electron spin system is transferred to the nuclear spin system of the nuclei present in the examination zone, resulting in an enhanced nuclear magnetization, the nuclear magnetization vector initially pointing in the z direction in conformity with the first steady magnetic field $B_{01}$.

The current source 4 for the magnet 2 is switched on (second line of FIG. 2) even before current generator 3 for the magnet 1 is switched off again by the control unit 15, so that the two steady magnetic fields B01 and B02 overlap in time. Subsequently, the current generator 3 for the magnet 1 is switched off so-that only the field B02 remains. The nuclear magnetization initially retains its enhanced value which is due to the ESR saturation, but it is always oriented in conformity with the steady magnetic field active at this time.

After the disappearance of the steady magnetic field $B_{01}$ (and before decay of the enhanced nuclear magnetization), an MR experiment is performed, the control unit 5 then switching on and modulating the RF current source 9 in such a manner that the RF pulse of the MR RF magnetic field as shown on the fourth line of FIG. 2 is obtained; this pulse rotates the magnetization vector out of the direction of the still active steady magnetic field $B_{02}$.

During this MR experiment, magnetic gradient fields G which extend in the x, the y and the z direction (i.e. magnetic fields which extend in the direction of the steady magnetic field $B_{02}$ and have a gradient in the x, the y and the z direction) can be generated in known manner by gradient coils which are not shown in FIG. 1; these gradient fields are diagrammatically indicated on the fifth line of FIG. 2 and limit the rotation of the nuclear magnetization vector due to the MR RF pulse to one slice or encode the phase of the MR signals in a location-dependent manner. The MR signals (sixth line of FIG. 2) are received by the MR coil 6 while at least one of these gradient fields is still active, are amplified by the amplifier 10, digitized and subsequently used for the reconstruction of the nuclear magnetization distribution in the examination zone or in a given slice of the examination zone. After an interval which is sufficiently long for the nuclear spin system to return to its state prior to the activation of the steady magnetic field $B_{01}$, the routine shown in FIG. 2 can be repeated with a different position code.

Figure 3:
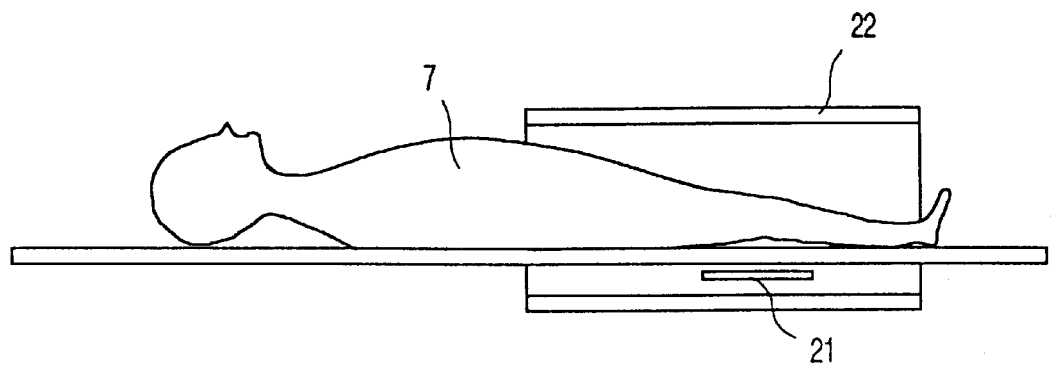
Figure 5:
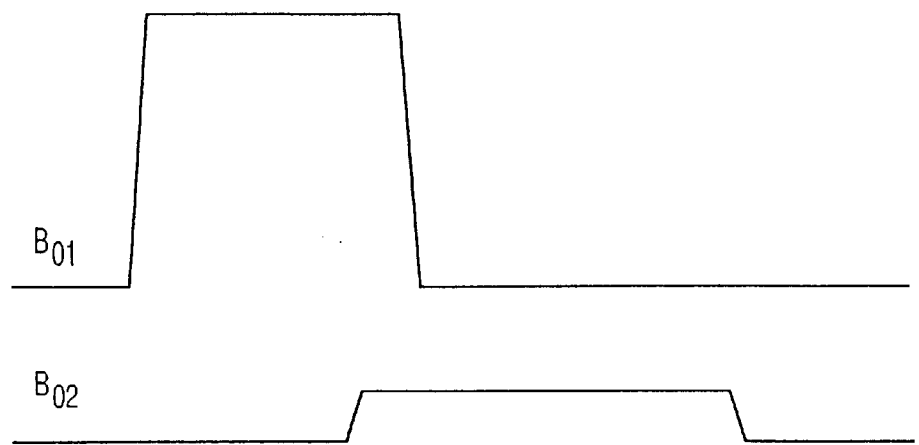
FIG. 5 shows the variation in time of the steady magnetic fields in such apparatus.

FIG. 3 shows the magnet system of a different embodiment of an MR apparatus according to the invention. A first magnet is formed by a surface coil 21 which generates in its immediate vicinity a strong but also very inhomogeneous magnetic field $B_{01}$ which extends perpendicularly to the longitudinal direction of the patient 7. A second magnet 22 generates a very homogeneous steady magnetic field $B_{02}$ which extends in the longitudinal direction of the patient 7 but is significantly weaker than the first magnetic field $B_{01}$. FIG. 5 shows the variation in time of both magnetic fields. The nuclear magnetization enhanced by the first steady magnetic field initially is sustained after the switching off of this magnetic field and is rotated in the direction of the already switched-on second steady magnetic field. As has already been explained, an MR experiment which utilizes the improvement of the signal-to-noise ratio due to the (still) enhanced nuclear magnetization, can be carried out in this phase.

Figure 4:
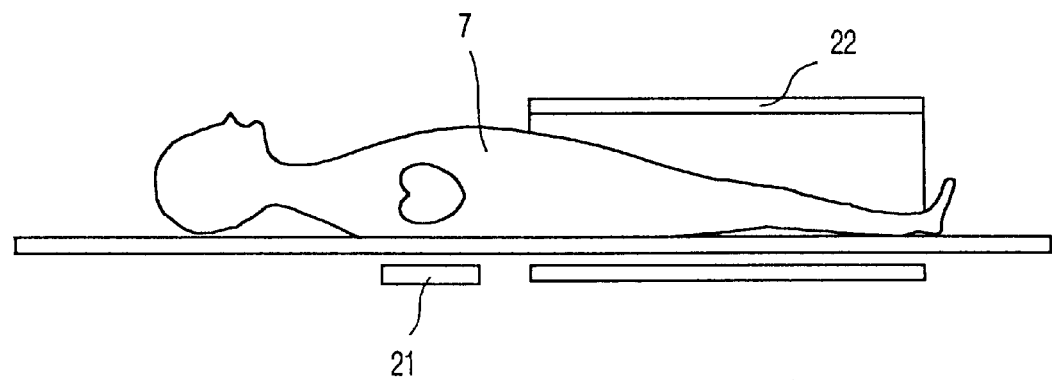
FIG. 4 shows a third embodiment of an MR apparatus.

FIG. 4 shows a different embodiment in which the two magnet systems 21 and 22 are arranged so as to be offset in space. The magnet system 21 generates a strong, inhomogeneous magnetic field $B_{01}$ at the area of the heart of the patient 7 (in the x direction or the y direction), with the result that the nuclear magnetization in the blood flowing through the cardiac chambers is enhanced. This blood, and the enhanced nuclear magnetization therein, flows in the direction of the legs of the patient where the second magnet system is situated; the second magnet system orients the nuclear magnetization in the z direction. It is important that the space between the two magnets 21 and 22 does not remain free from fields; the nuclear spins should always be subject to at least one of the two magnetic fields, so that the nuclear magnetization gradually changes over from the direction of the magnetic field $B_{01}$ to the direction $B_{02}$. The distribution of the nuclear magnetization at the area of the second magnet system can then be determined by means of a customary MR experiment. The signal-to-noise ratio of the MR signals then received is determined essentially by the steady magnetic field $B_{01}$.

The MR image derived from the received MR signals reproduces the vascular system of the patient. The contrast in this image can be intensified by subtracting from this MR image the MR image which is obtained when the same sequence is executed, however, without application of the steady magnetic field $B_{01}$.

All reference cited herein, as well as the priority document German Patent Application 19911043.3 filed Mar. 12, 1999, are incorporated herein by reference in their entirety and for all purposes to the same extent as if each individual publication or patent or patent application was specifically and individually indicated to be incorporated by reference in its entirety for all purposes.

What is claimed is:

1. A magnetic resonance (MR) method comprising:

generating in nuclei enhanced nuclear magnetization in in nuclei an examination zone with an electron spin resonance (ESR) RF magnetic field under the influence of a first steady magnetic field generated by a first magnet disposed in a fixed position relative said examination zone, applying a second steady magnetic field to the nuclei previously influenced by the first magnetic field, and carrying out at least one MR experiment after the first steady magnetic field has ceased to act on the nuclei but before the nuclear magnetization influenced by this magnetic field has decayed, the MR experiment including the excitation of the nuclear magnetization by an MR RF magnetic field under the influence of the second steady magnetic field, wherein the directions of the first and the second steady magnetic field enclose an angle other than 0° relative to one another, and that the two steady magnetic fields overlap in time.

2. An MR method as claimed in claim 1 wherein the step of generating of the enhanced nuclear magnetization further comprises exciting electron spin resonance (ESR) of a contrast agent, present in an object to be examined and containing un-paired electrons under the influence of the first steady magnetic field, by the ESR RF magnetic field, and wherein the directions of the ESR RF magnetic field and the MR RF magnetic field enclose an angle of at least approximately 90° relative to one another.

3. An MR method as claimed in claim 2 wherein the first steady magnetic field is weaker than the second steady magnetic field.

4. A device for carrying out the method claimed in claim 2 comprising:
   said first for generating the first steady magnetic field,
   an ESR RF coil system for generating the ESR RF magnetic field which extends at least substantially perpendicularly to the first steady magnetic field,
   an MR RF coil system for generating and/or receiving the MR RF magnetic field,
   a second magnet for generating the second steady magnetic field whose direction encloses an angle other that 0° relative to the direction of the first steady magnetic field, and
   wherein the direction of the MR RF magnetic field extends at least substantially perpendicularly to the direction of the second steady magnetic field and to the direction of the ESR RF magnetic field.

5. A device as claimed in claim 4 wherein the MR RF coil system and the ESR RF coil system extend coaxially to one another, such that one encloses the other.

6. A device as claimed in claim 5 wherein the MR RF coil system further comprises a solenoid coil.

7. A device as claimed in claim 5 wherein the ESR RF coil system further comprises a quadrature coil of the bird-cage type.

8. A device as claimed in claim 5 wherein the ESR RF coil system further comprises a transverse electromagnetic (TEM) resonator.

9. A device as claimed in claim 5 wherein the ESR RF coil system further comprises an array of surface coils enclosing a cylindrical space.

10. The device of claim 4 wherein the directions of the first and the second steady magnetic field enclose an angle of approximately 90° relative to one another.

11. An MR method as claimed in claim 1 wherein the first steady magnetic field is switched on and off in a pulsed manner and is stronger than the second steady magnetic field, and that the homogeneity of the second steady magnetic field is greater than that of the first steady magnetic field.

12. An MR method as claimed in claim 1 wherein the first steady magnetic field acts on a first part of a patient and the second steady magnetic field acts on a second part of the patient, with blood flowing from the first part to the second part.

13. The method of claim 1 wherein the directions of the first and the second steady magnetic field enclose an angle of approximately 90° relative to one another.

* * * * *